US 6,661,312 B2

(12) United States Patent
Orihara

(10) Patent No.: US 6,661,312 B2
(45) Date of Patent: Dec. 9, 2003

(54) MULTILAYER FILTER ARRAY

(75) Inventor: Masashi Orihara, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/191,318

(22) Filed: Jul. 10, 2002

(65) Prior Publication Data

US 2003/0025575 A1 Feb. 6, 2003

(30) Foreign Application Priority Data

Aug. 6, 2001 (JP) .................................... 2001-237389

(51) Int. Cl.[7] ................................................ H03H 7/01
(52) U.S. Cl. ...................... 333/185; 333/172; 333/133; 333/134; 333/132; 333/177; 333/204
(58) Field of Search ................ 333/185, 172, 333/177, 133, 134, 193, 174

(56) References Cited

U.S. PATENT DOCUMENTS

| 5,450,278 | A | * | 9/1995 | Lee et al. .................... 333/185 |
|---|---|---|---|---|
| 5,668,511 | A | * | 9/1997 | Furutani et al. ............. 333/185 |
| 5,822,174 | A | * | 10/1998 | Yamate et al. ............... 333/185 |
| 5,834,994 | A | * | 11/1998 | Shapiro ........................ 333/185 |
| 6,061,227 | A | * | 5/2000 | Nogi ............................ 333/185 |
| 6,115,234 | A | * | 9/2000 | Ishii et al. .................... 333/185 |
| 6,147,571 | A | * | 11/2000 | Kitazawa et al. ............ 333/185 |
| 6,147,573 | A | * | 11/2000 | Kumagai et al. ............ 333/185 |
| 6,191,666 | B1 | * | 2/2001 | Sheen .......................... 333/185 |
| 6,411,178 | B1 | * | 6/2002 | Matsumura et al. ......... 333/185 |
| 6,437,666 | B1 | * | 8/2002 | Matsumura et al. ......... 333/185 |
| 6,587,020 | B2 | * | 7/2003 | Tojyo ........................... 333/185 |

FOREIGN PATENT DOCUMENTS

JP        2001-60840        3/2001

* cited by examiner

Primary Examiner—Michael Tokar
Assistant Examiner—Lam T. Mai
(74) Attorney, Agent, or Firm—Oblon, Spivak, McClelland, Maier & Neustadt, P.C.

(57) ABSTRACT

A multilayer filter array, which is formed by layering a plurality of conductive patterns, includes: coils corresponding to respective plurality of lines, which are formed by arranging the plurality of conductive patterns respectively to a single insulator layer; and capacitors corresponding to respective plurality of lines, which are formed by facing the conductive patterns to each other with insulator layers therebetween on insulator layers differing from the insulator layers the coils exist thereupon, wherein only a single conductive pattern, which configures a capacitor corresponding to a respective line, of the capacitors corresponding to respective plurality of lines, is deployed on each respective insulator layer forming each of the capacitors. Accordingly, inductance and capacitance become independently adjustable, as in addition, disparity of damping characteristics between signal lines may be made smaller.

19 Claims, 12 Drawing Sheets

FIG. 1
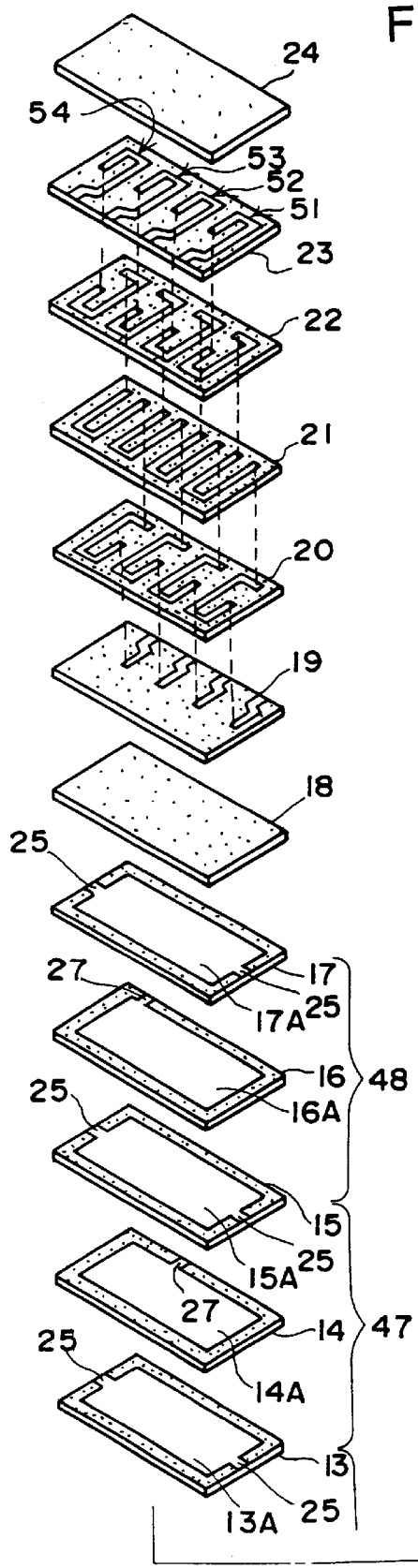
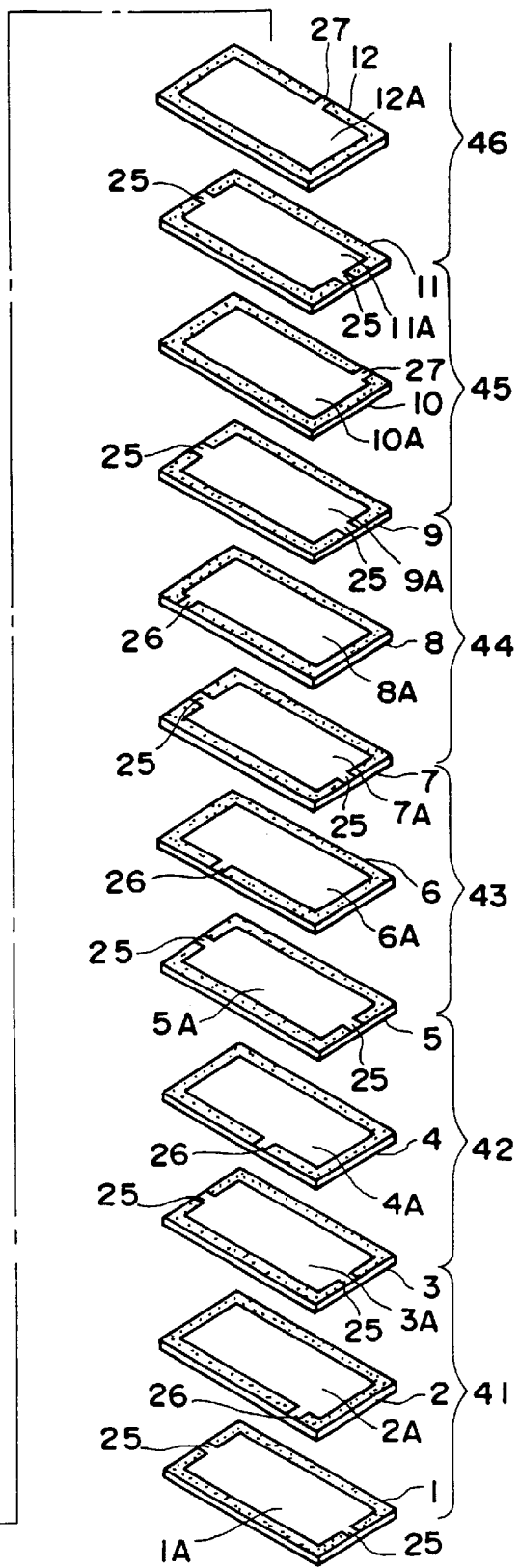

F I G. 5A 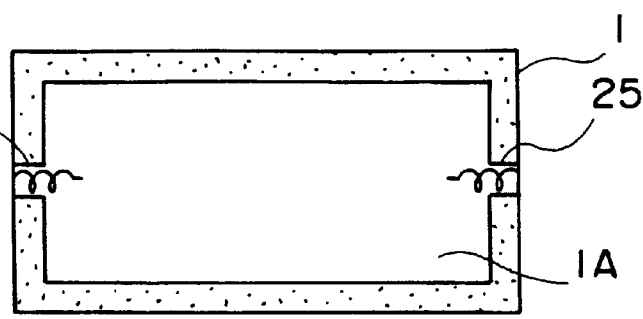
F I G. 5B 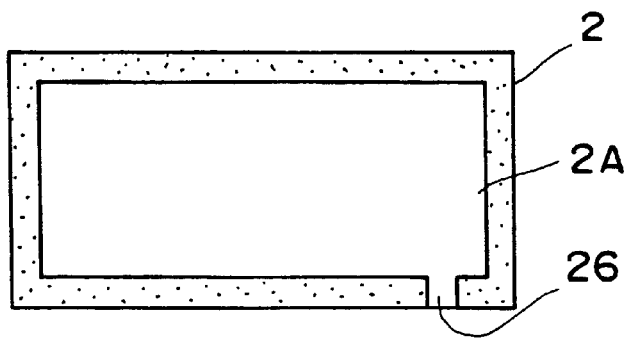
F I G. 5C 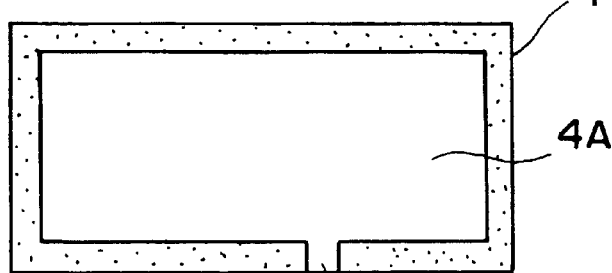
F I G. 5D 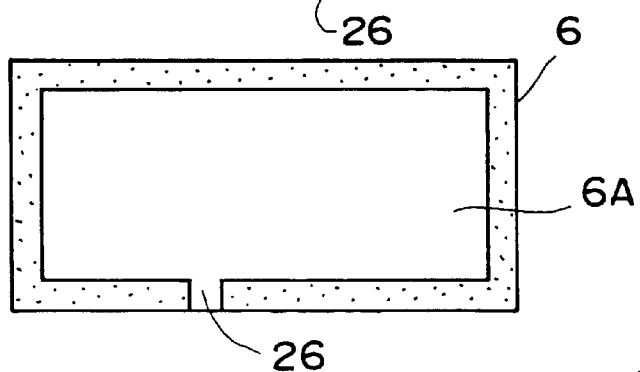
F I G. 5E 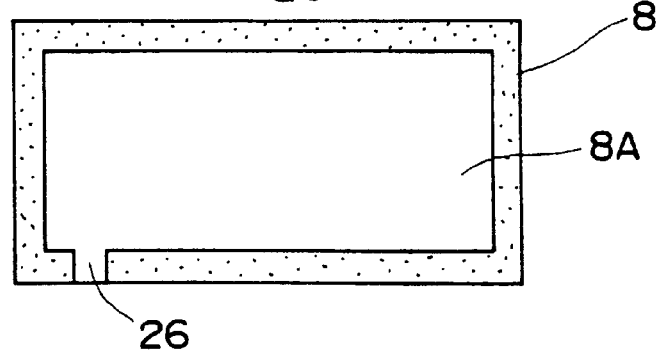

MULTILAYER FILTER ARRAY

BACKGROUND OF THE INVENTION

1. Field of the Invention

The present invention relates to a multilayer filter array, which is compact and has capability of considerable noise minimization, and is used in noise elimination for electrical equipment and the like.

2. Description of the Related Art

Demands for miniaturization and weight reduction of equipment whereto electronic components are integrated have been recently increasing; thus, demands for small-sized multilayer electronic components have been rapidly increasing. By integrating a plurality of coils and capacitors respectively, a filter array, which is an arrayed noise filter, has come into use as a type of multilayer electronic component for high-frequency noise countermeasures of circuit boards.

The internal configuration of this conventional filter array, which is an arrayed noise filter, is illustrated in FIG. 9.

In other words, this filter array has a configuration of layered insulator layers 1 through 16, wherein conductive patterns 101A through 109A and conductive patterns 111A through 115A, which respectively configure each signal line of this filter array, are arranged within each respective layer as illustrated in FIG. 9.

In addition, it has a configuration wherein coils 141 through 144 and capacitors 131 through 138 are connected therebetween by input/output terminals 171A through 174B (shown in FIG. 10) of the respective lines, which are provided at both side surfaces of this filter array. Furthermore, it is also a configuration wherein ground terminals 175, 176 (shown in FIG. 10) are arranged at both end surfaces of the filter array.

However, in the configuration of the conventional filter array shown in FIG. 9, the ground conductive pattern 101A, which is shown typified in FIG. 11A, has three narrow portions 121 such as to have a form corresponding to each conductive pattern 102A shown typified in FIG. 11B.

Consequently, inductance has inevitably increased due to making the configuration of each ground conductive patterns 101A, 103A, 105A, 107A and 109A respectively having a plurality of narrow portions 121. In other words, other than coils 160 and 164 actually existing at both end lead-out portions 122 as with the equivalent circuit shown in FIG. 10 of this conventional filter array, coils 161, 162, 163 actually exist so as to correspond to the inner side of these narrow portions 121.

As a result, in consequence of the inductance due to the coil 161, the damping characteristic of the noise filter between the input/output terminals 172A and 172B is degraded. Consequently, there is a drawback of vastly differing characteristics between the damping characteristic of the noise filter positioned between the input/output terminals 171A and 171B (indicated by the dotted line in FIG. 12) and the damping characteristic of this noise filter positioned between the input/output terminals 172A and 172B (indicated by the solid line in FIG. 12), as shown in FIG. 12. Furthermore, it can be similarly said that the damping characteristics of the noise filter between the input/output terminals 172A and 172B and the noise filter between the input/output terminals 173A and 173B differ; and it can be similarly said that the damping characteristics of the noise filter between the input/output terminals 173A and 173B and of the noise filter between the input/output terminals 174A and 174B differ.

On the other hand, a filter array with a distributed-constant construction, whereby signal side coils and ground side coils are opposingly arranged via the insulator layers such that the inductance of each ground side coil mutually correspond, is disclosed in the Japanese Patent Application Laid-open No. 2001-60840. However, with the structure of the filter array disclosed in this publication, since the coil inductance values and the capacitor capacitance values cannot respectively be independently changed, there is the drawback whereby control of damping characteristics is difficult.

SUMMARY OF THE INVENTION

The present invention aims to provide a multilayer filter array, which is able to independently adjust inductance and capacitance, as well as make disparity of damping characteristics between signal lines small.

According to a first aspect of the present invention, a multilayer filter array, which is formed by layering a plurality of insulator layers in a state where a plurality of conductive patterns are internally arranged, comprising coils corresponding to respective plurality of lines, which are formed by arranging the plurality of conductive patterns respectively to a single insulator layer; and capacitors corresponding to respective plurality of lines, which are formed by facing the conductive patterns to each other with insulator layers therebetween on insulator layers differing from the insulator layers the coils exist thereupon, wherein only a single conductive pattern, which configures a capacitor corresponding to a respective line, of the capacitors corresponding to respective plurality of lines, is deployed on each respective insulator layer forming each of the capacitors, is provided.

According to such multilayer filter array, operations as in the following take effect.

The multilayer filter array according to this aspect is formed by layering a plurality of insulator layers in a state where a plurality of conductive patterns are internally arranged. Then, coils corresponding to respective plurality of lines are formed by arranging the plurality of conductive patterns respectively to a single insulator layer. In addition, capacitors corresponding to respective plurality of lines are formed by facing the conductive patterns to each other with insulator layers therebetween on insulator layers differing from the insulator layers the coils exist thereupon.

Moreover, it is a configuration wherein only a single conductive pattern, which configures a capacitor corresponding to a respective line, of the capacitors corresponding to respective plurality of lines, is arranged on each respective insulator layer forming each of the capacitors. Thus, the arrangements and configurations of the conductive patterns forming the capacitors are made to differ from those of conventional techniques.

As a result, in this aspect, it has a configuration wherein not only are the coils and capacitors arranged on different insulator layers from each other, but only a single conductive pattern, which configures a capacitor corresponding to a respective line, of the capacitors corresponding to respective plurality of lines, is arranged on each respective insulator layer. Thus, for example, by merely changing the width of the conductive patterns or the number of insulator layers, not only may the inductance of coils be adjusted, but the capacitance of capacitors may be independently and easily adjusted.

Furthermore, signal conductive patterns and ground conductive patterns exist among the conductive patterns forming the capacitors of this aspect. However, by arranging on each insulator layer only a single conductive pattern, which configures a capacitor corresponding to a respective line, of the capacitors corresponding to respective plurality of lines, the narrow portion that existed in the conventional technique multilayer filter array disappears, and the inductance of the ground conductive patterns forming the capacitors becomes small.

Accordingly, since the degradation of the damping characteristics is reduced, the originally designed strong damping characteristics are obtained; moreover since no difference of inductance between each signal line made from the respective ground conductive patterns occurs, difference in damping characteristics between each signal line may be reduced.

Moreover, as the conductive patterns or internal electrodes, which determine the capacity of the capacitors corresponding to respective lines, are not adjacent to each other within the same layer, the capacitor capacity that existed between each line with the conventional techniques does not exist, and cross talk is reduced.

On the other hand, setting the relative dielectric constant of the insulator layers forming the capacitors between 20 and 200, and setting the relative dielectric constant of the insulator layers the coils are arranged thereupon to no more than 15 may be considered as a modified example of the multilayer filter array according to this aspect.

In other words, since the relative dielectric constant of the insulator layers that the coils form is set to no more than 15, the capacitance values between the coils are made smaller, and inter-channel cross talk is reduced. Moreover, taking into account characteristic degradation due to the capacitance generated between the input/output terminals, it is preferable that the relative dielectric constant of the insulator layers forming the capacitors is set to no more than the above-mentioned 200. Furthermore, from the aspect of ensuring the necessary minimum capacitance, it is preferable that the relative dielectric constant of the insulator layers forming the capacitors is to at least the above-mentioned 20.

According to another aspect of the present invention, a multilayer filter array, which is formed by layering a plurality of insulator layers in a state where a plurality of conductive patterns are internally arranged, comprising coils corresponding to respective plurality of lines, which are formed by arranging the plurality of conductive patterns respectively to a single insulator layer; and capacitors corresponding to respective plurality of lines, which are formed by facing the conductive patterns to each other with insulator layers therebetween on insulator layers differing from the insulator layers the coils exist thereupon, wherein only a single conductive pattern, which configures a capacitor corresponding to a respective line, of the capacitors corresponding to respective plurality of lines, is deployed on each respective insulator layer forming each of the capacitors, and external electrodes are arranged on the outside of a main layered body part, which is formed by layering the insulator layers, thereby the coils and the capacitors are connected by these external electrodes, is provided.

According to such multilayer filter array, operations as in the following take effect.

The multilayer filter array according to this aspect has the same configuration as the above-mentioned first aspect; moreover, it has a configuration such that external electrodes are arranged on the outside of a main layered body part, which is formed by layering the insulator layers, thereby the coils and the capacitors are connected therebetween by these external electrodes, which are arranged on the outside of the multilayer filter array. Thus, effective utilization of the internal portions of the multilayer filter array is possible, and in addition, usage of conductive material that passes through via holes and the like of the insulator layers is reduced, allowing for low cost fabrication of the multilayer filter array.

According to yet another aspect of the present invention, a multilayer filter array, which is formed by building up a plurality of insulator layers in a state where a plurality of conductive patterns are internally arranged, comprising coils corresponding to respective plurality of lines, which are formed by arranging the plurality of conductive patterns respectively to a single insulator layer; and capacitors corresponding to respective plurality of lines, which are formed by facing the conductive patterns to each other with insulator layers therebetween on insulator layers differing from the insulator layers the coils exist thereupon, wherein only a single conductive pattern, which configures a capacitor corresponding to a respective line, of the capacitors corresponding to respective plurality of lines, is deployed on each respective insulator layer forming each of the capacitors, and external signal electrodes, which connect to the conductive patterns for signaling, and external ground electrodes, which connect to the conductive patterns for grounding, are arranged side by side on the same side surface of a main layered body part, which is formed by layering insulator layers, is provided.

According to such multilayer filter array, operations as in the following take effect.

The multilayer filter array according to this aspect has the same configuration as the above-mentioned first aspect; moreover, it has a configuration wherein external signal electrodes, which connect to the conductive patterns for signaling, and external ground electrodes, which connect to the conductive patterns for grounding, are arranged side by side on the same side surface of a main layered body part, which is formed by layering insulator layers.

In other words, since the external signal electrodes and the external ground electrodes are arranged in a line on the same side surface of the main layered body part, surfaces of the multilayer filter array with no external electrodes increase. As a result, other electronic devices can be deployed much closer on a printed board whereupon this multilayer filter array is placed, by the virtue of this multilayer filter array. Thus, according to this aspect, higher density layout of electronic devices on printed boards is possible.

BRIEF DESCRIPTION OF DRAWINGS

FIG. 1 is an exploded perspective view illustrating the build up structure of a multilayer filter array according to a first embodiment of the present invention.

FIG. 5A is a planar view of the lowest layer among the insulator layers of the multilayer filter array according to the first embodiment of the present invention; FIG. 5B is a planar view of the second layer from the bottom among the insulator layers of the multilayer filter array according to the first embodiment of the present invention; FIG. 5C is a planar view of the fourth layer from the bottom among the insulator layers of the multilayer filter array according to the first embodiment of the present invention; FIG. 5D is a planar view of the sixth layer from the bottom among the insulator layers of the multilayer filter array according to the first embodiment of the present invention; and FIG. 5E is a planar view of the eighth layer from the bottom among the insulator layers of the multilayer filter array according to the first embodiment of the present invention.

DETAILED DESCRIPTION OF THE PREFERRED EMBODIMENTS

Hereinafter, the present invention will be clarified by describing the first embodiment of a multilayer filter array according to the present invention while referencing the drawings.

Figure 3:
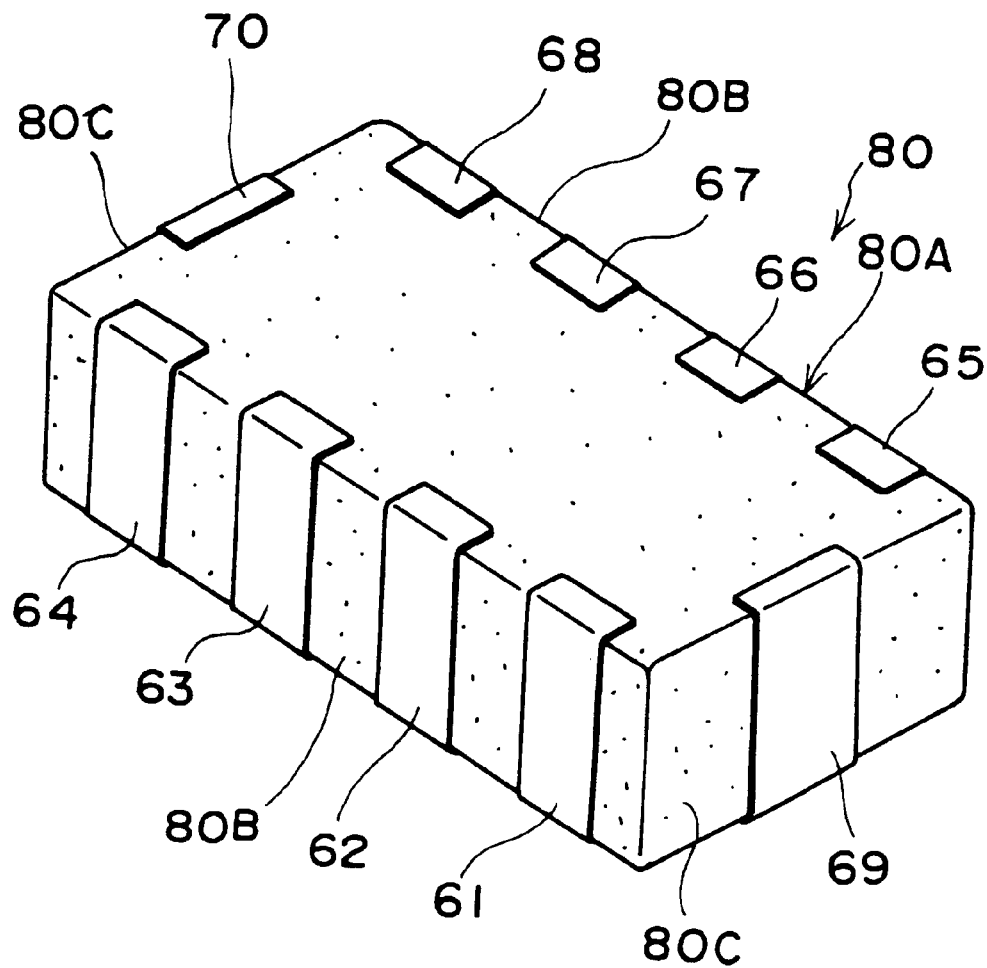
FIG. 3 is a perspective view illustrating the multilayer filter array according to the first embodiment of the present invention.

As shown in FIG. 1 and FIG. 3, a multilayer filter array 80 according to this embodiment has a main layered body portion 80A as its principal part, which has a rectangular parallelepiped structure, wherein twenty-four insulator layers of insulator layers 1 through 24, which are respectively formed in a rectangular sheet form, are layered.

As shown in FIG. 1, insulator layers 1 through 17, which are layered so as to configure the lower part of the multilayer filter array 80, have conductive patterns 1A through 17A respectively arranged thereupon in order from the bottom, which are respectively formed through printing or the like in a rectangular shape.

Then, the conductive patterns 1A, 2A, 3A, and the insulator layers 2, 3 positioned therebetween form a capacitor 41; and the conductive patterns 3A, 4A, 5A, and the insulator layers 4, 5 positioned therebetween form a capacitor 42. Likewise, the conductive patterns 5A, 6A, 7A, and the insulator layers 6, 7 positioned therebetween form a capacitor 43; and the conductive patterns 7A, 8A, 9A, and the insulator layers 8, 9 positioned therebetween form a capacitor 44.

Furthermore, the conductive patterns 9A, 10A, 11A, and the insulator layers 10, 11 positioned therebetween form a capacitor 45; and the conductive patterns 11A, 12A, 13A, and the insulator layers 12, 13 positioned therebetween form a capacitor 46. Moreover, the conductive patterns 13A, 14A, 15A, and the insulator layers 14, 15 positioned therebetween form a capacitor 47; and the conductive patterns 15A, 16A, 17A, and the insulator layers 16, 17 positioned therebetween form a capacitor 48.

Accordingly, the capacitors 41 through 48 corresponding to respective plurality of lines are formed by the insulator layers 2 through 17 and the conductive patterns 1A through 17A, which are respectively arranged upon the 17 layers of the insulator layers 1 through 17, whereby only a single conductive pattern, which configures a capacitor corresponding to a respective line, of these capacitors 41 through 48 corresponding to respective plurality of lines, is deployed upon each respective insulator layer 1 through 17.

Moreover, a pair of lead-out portions 25, which protrude at the front side and back side of the respective insulator layer end portions of the conductive patterns 1A, 3A, 5A, 7A, 9A, 11A, 13A, 15A, and 17A as in FIG. 1, are formed for these conductive patterns.

Furthermore, lead-out portions 26, which protrude at varied positions in order from the front side portion of the conductive patterns 2A, 4A, 6A, 8A towards the front side of the respective insulator layers as in FIG. 1, are formed for these conductive patterns. Moreover, lead-out portions 27, which protrude at varied positions in order from the back side portion of the conductive patterns 10A, 12A, 14A, 16A towards the back side of the respective insulator layers as in FIG. 1, are formed for these conductive patterns.

Figure 2:
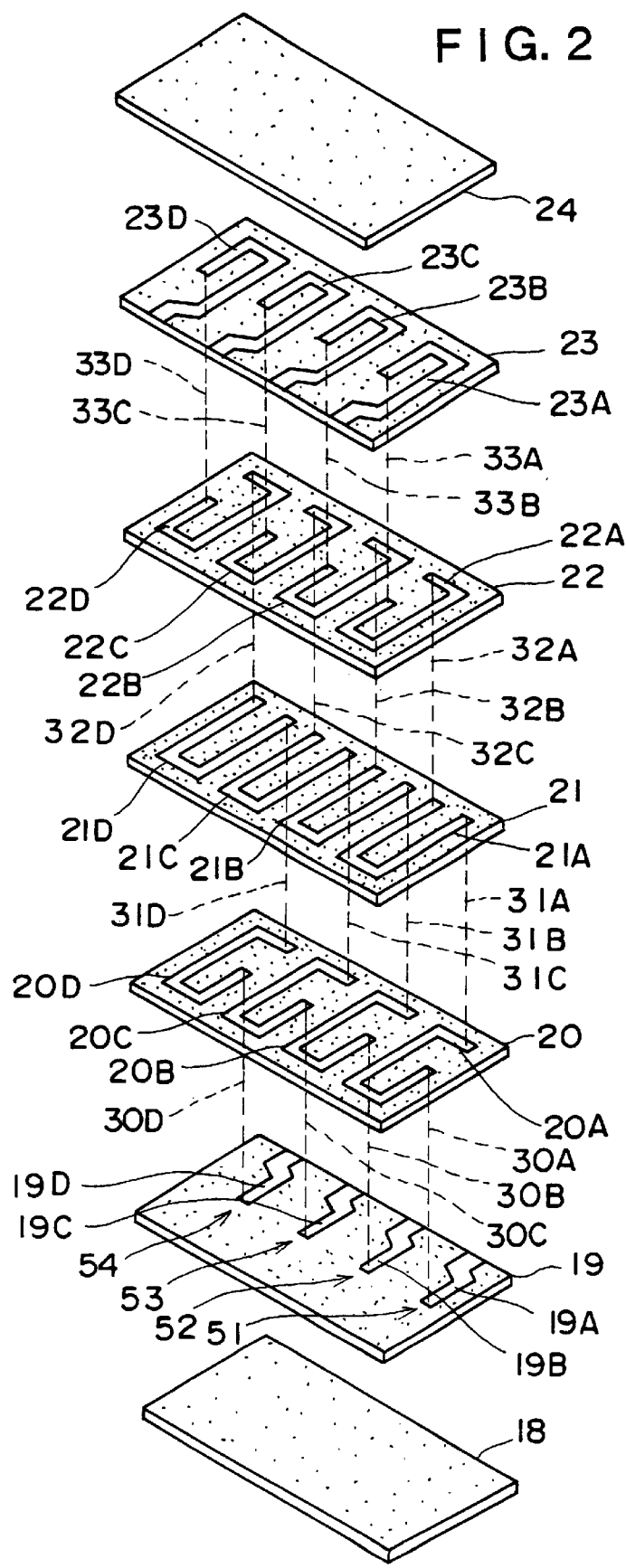
FIG. 2 is an enlarged exploded perspective view showing the peripheral portions of coils within the build up structure of FIG. 1.

Meanwhile, the insulator layers 19 through 23 are further layered in order above the upper portion of the insulator layer 17, wherein the insulator layer 19 has conductive patterns 19A, 19B, 19C, 19D, which have one end sides extending to the back side portion of the insulator layer 19, respectively arranged in order from the front side of FIG. 2 along the length thereof.

Furthermore, an insulator layer 20 has approximately C-shaped conductive patterns 20A, 20B, 20C, 20D respectively arranged in order from the front side of FIG. 2 along the length thereof. An insulator layer 21 has approximately U-shaped conductive patterns 21A, 21B, 21C, 21D respectively arranged in order from the front side of FIG. 2 along the length thereof.

Moreover, an insulator layer 22 has approximately C-shaped conductive patterns 22A, 22B, 22C, 22D respectively arranged in order from the front side of FIG. 2 along the length thereof. An insulator layer 23 has approximately U-shaped conductive patterns 23A, 23B, 23C, 23D respectively arranged in order from the front side of FIG. 2 along the length thereof. One end sides of these conductive patterns 23A, 23B, 23C, 23D respectively extend to the front side portion of the insulator layer 23.

At the same time, conductive patterns 19A through 23A are connected through via holes 30A through 33A, which respectively pass through the insulator layers 20 through 23, configuring a coil 51. Furthermore, conductive patterns 19B through 23B are connected through via holes 30B through 33B, which respectively pass through the insulator layers 20 through 23, configuring a coil 52.

Moreover, conductive patterns 19C through 23C are connected through via holes 30C through 33C, which respectively pass through the insulator layers 20 through 23, configuring a coil 53. Furthermore, conductive patterns 19D through 23D are connected through via holes 30D through 33D, which respectively pass through the insulator layers 20 through 23, configuring a coil 54.

Thus, the coils 51 through 54 corresponding to a plurality of respective lines are formed by respectively arranging a plurality of conductive patterns onto the insulator layers 19 through 23. Furthermore, there are the capacitors 41 through 48 corresponding to a plurality of lines formed on the insulator layers 1 through 17, which differ from the insulator layers 19 through 23 whereupon these coils 51 through 54 exist, facing the conductive patterns with insulator layers therebetween.

The insulator layer 18 is layered in between the above-mentioned insulator layer 17 and insulator layer 19 for adjusting the distance between the conductive patterns, which respectively form these coils 51 through 54 and capacitors 41 through 48. Furthermore, an insulator layer 24 is layered upon the upper portion of the insulator layer 23 as a base layer for protecting the conductive patterns 23A, 23B, 23C, and 23D.

Then, one end of the coil 51 and the lead-out portion 26 of the conductive pattern 2A, which is a terminal part of the capacitor 41, are connected by an exterior electrode 61, which is arranged at the rightmost side of the front side surface 80B of the main layered body part 80A of the multilayer filter array 80 illustrated in FIG. 3. The other end of this coil 51 and the lead-out portion 27 of the conductive pattern 10A, which is a terminal part of the capacitor 45, are also connected by an exterior electrode 65, which is arranged at the rightmost side of the back side surface 80B of the main layered body part 80A of the multilayer filter array 80.

Furthermore, one end of the coil 52 and the lead-out portion 26 of the conductive pattern 4A, which is a terminal part of the capacitor 42, are also connected by an exterior electrode 62, which is arranged second from the right of the front side surface 80B of the main layered body part 80A of the multilayer filter array 80. The other end of this coil 52 and the lead-out portion 27 of the conductive pattern 12A, which is a terminal part of the capacitor 46, are also connected by an exterior electrode 66, which is arranged second from the right of the back side surface 80B of the main layered body part 80A of the multilayer filter array 80.

Moreover, one end of the coil 53 and the lead-out portion 26 of the conductive pattern 6A, which is a terminal part of the capacitor 43, are also connected by an exterior electrode 63, which is arranged third from the right of the front side surface 80B of the main layered body part 80A of the multilayer filter array 80. The other end of this coil 53 and the lead-out portion 27 of the conductive pattern 14A, which is a terminal part of the capacitor 47, are also connected by an exterior electrode 67, which is arranged third from the right of the back side surface 80B of the main layered body part 80A of the multilayer filter array 80.

Furthermore, one end of the coil 54 and the lead-out portion 26 of the conductive pattern 8A, which is a terminal part of the capacitor 44, are also connected by an exterior electrode 64, which is arranged at the leftmost side of the front side surface 80B of the main layered body part 80A of the multilayer filter array 80. The other end of this coil 54 and the lead-out portion 27 of the conductive pattern 16A, which is a terminal part of the capacitor 48, are also connected by an exterior electrode 68, which is arranged at the leftmost side of the back side surface 80B of the main layered body part 80A of the multilayer filter array 80.

In other words, as illustrated in FIG. 3, the exterior electrodes 61 through 68, which are a total of eight external signal electrodes, are arranged as four input/output terminals on each side surface 80B of the main layered body part 80A of the rectangular parallelepiped-formed multilayer filter array 80. Furthermore, since the exterior electrodes 69, 70, which are a total of two exterior ground electrodes, are arranged at both end surfaces 80C, which are differing sides of the main layered body part 80A from both side surfaces 80B, while being connected to the lead-out portions 25, which protrude at the respectively corresponding parts, the multilayer filter array 80 according to this embodiment has a four consecutive structure.

Then, the conductive patterns 2A, 4A, 6A, 8A, 10A, 12A, 14A, 16A of the conductive patterns 1A through 17A, which configure the capacitors 41 through 48 of the multilayer filter array 80 according to this embodiment, are made to be signal conductive patterns. Furthermore, the conductive patterns 1A, 3A, 5A, 7A, 9A, 11A, 13A, 15A, 17A become ground conductive patterns.

Figure 4:
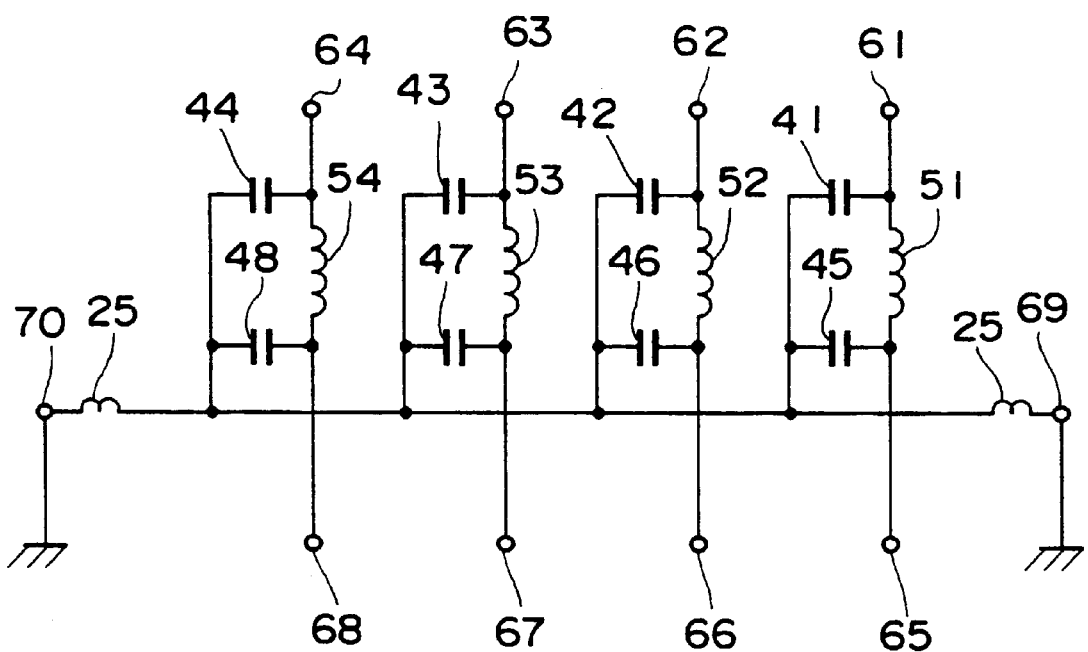
FIG. 4 is an equivalent circuit diagram of the multilayer filter array according to the first embodiment of the present invention.

Accordingly, the equivalent circuit of the multilayer filter array 80 according to this embodiment is as shown in FIG. 4.

Figure 10:
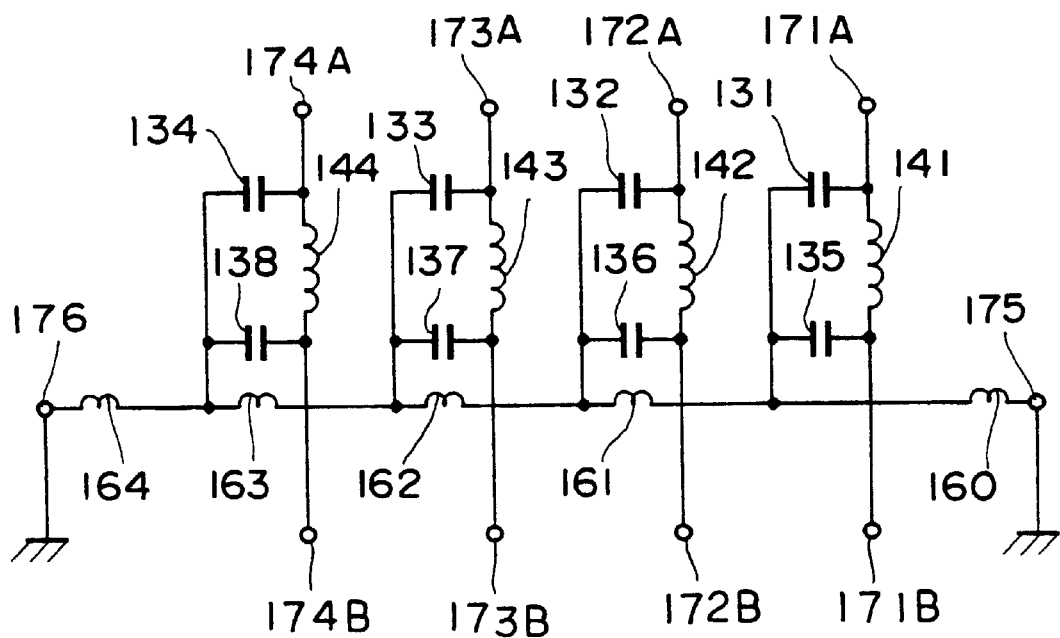
FIG. 10 is an equivalent circuit diagram of the multilayer filter array according to conventional techniques.
Figure 11A:
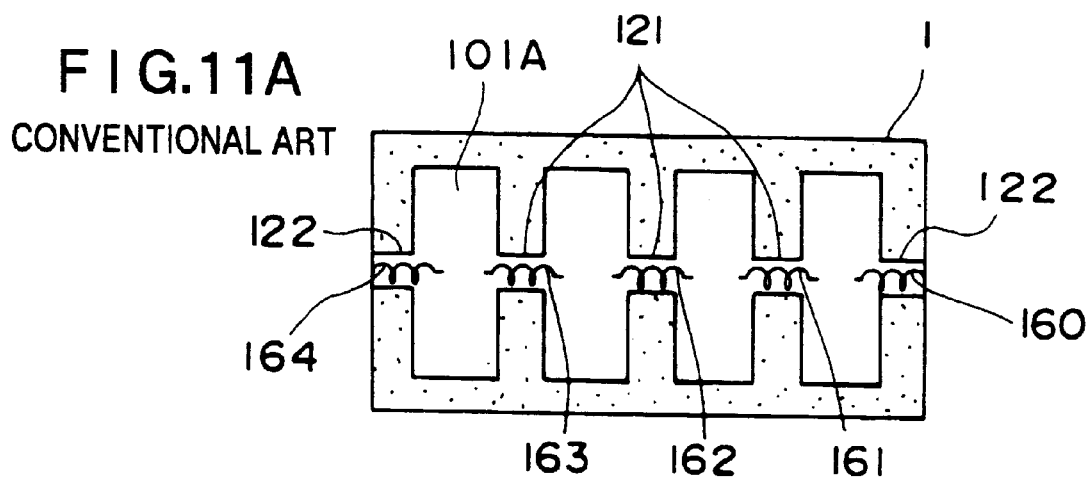
FIG. 11A is a planar view of the lowest layer among the insulator layers of the multilayer filter array according to conventional techniques.
Figure 11B:
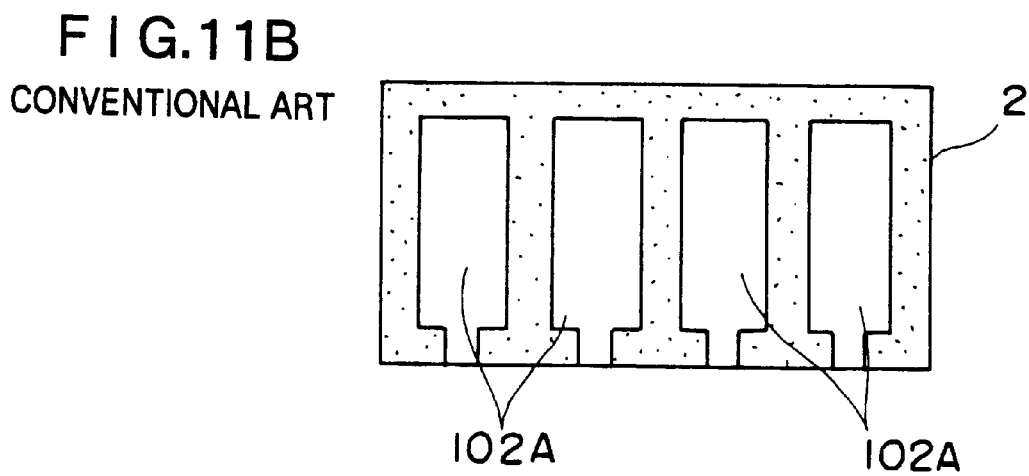
FIG. 11B is a planar view of the second layer from the bottom among the insulator layers of the multilayer filter array according to conventional techniques.

The coils 161 through 163 actually existed in the one of conventional techniques shown in FIG. 10, however, in the equivalent circuit of the multilayer filter array 80 according to this embodiment shown in FIG. 4, no narrow portions exist as shown in FIG. 5, thus these coils 161 through 163 do not exist.

It should be noted that the inductance values of the coils 51 through 54 and capacitance values of the capacitors 41 through 48 of the multilayer filter array 80 are adjustable depending on change in layer number and width of the conductive patterns. It should be further noted that in regard to the capacitors 41 through 48, the capacitance values are adjustable even by using materials differing in relative dielectric constant for the insulator layers. However, in this embodiment, the relative dielectric constant of the insulator layers 1 through 17, which form the capacitors 41 through 48, are between 20 and 200, and the relative dielectric constant of the insulator layers 19 through 23, whereupon the coils 51 through 54 are arranged, is no greater than 15.

Next, fabrication of the multilayer filter array 80 according to this embodiment is described.

During fabrication of this multilayer filter array 80, a plurality of sheet-like dielectric green sheets on which the insulator layers 1 through 24 of FIG. 1 are respectively deployed are formed, and then stacked on top of each other through a green sheet multilayer construction method. It should be noted that these dielectric green sheets are configured of material containing alumina and glass.

The conductive patterns 1A through 17A, conductive patterns 19A through 23A, conductive patterns 19B through 23B, conductive patterns 19C through 23C, and conductive patterns 19D through 23D are formed by printing conductive paste of silver, silver-palladium or the like onto the insulator layers. Furthermore, the via holes 30A through 33A, 30B through 33B, 30C through 33C, and 30D through 33D are likewise formed by filling in the insulator layers with the conductive paste.

Moreover, after layering these insulator layers 1 through 24, which become the dielectric green sheets, they are cut and baked for every chip. Subsequently, the external electrodes 61 through 70 are deployed by plating and the like, whereby the multilayer filter array 80 shown in FIG. 3 is complete.

Next, operations of the multilayer filter array 80 according to this embodiment is described hereinafter.

The multilayer filter array 80 according to this embodiment is formed by layering the insulator layers 1 through 24 in the state where conductive patterns are internally arranged. Then, coils 51 through 54 corresponding to respective plurality of lines are formed by respectively arranging a plurality of conductive patterns onto the insulator layers 19 through 23. There are capacitors 41 through 48 corresponding to respective plurality of lines formed on the insulator layers 1 through 17, which differ from the insulator layers 19 through 23 whereupon these coils 51 through 54 exist, facing the conductive patterns with insulator layers therebetween.

Furthermore, these coils 51 through 54 and the capacitors 41 through 48 are connected via the external electrodes 61 through 68 arranged on the outside of the main layered body part 80A, which is formed by layering the insulator layers 1 through 24.

Figure 9:
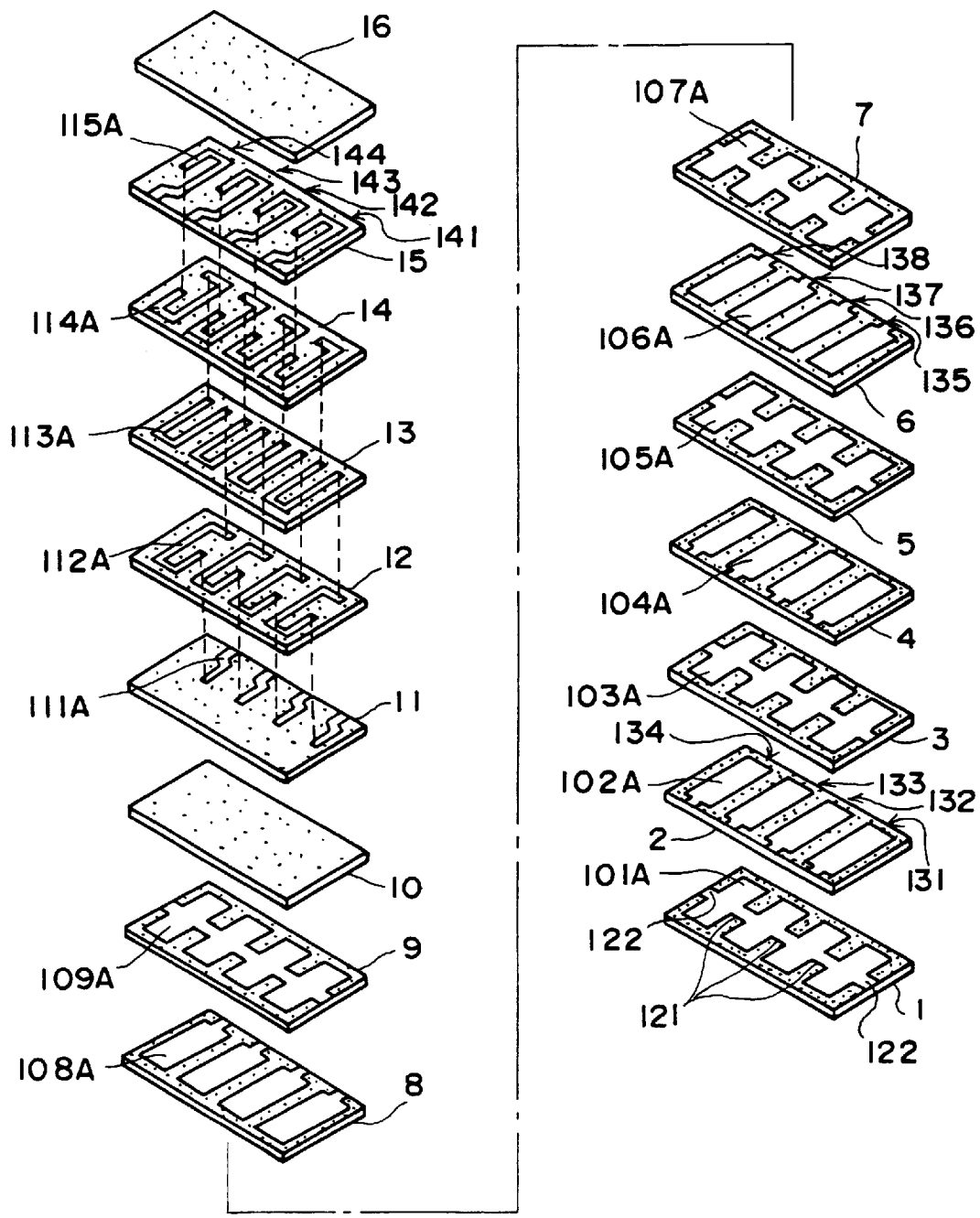
FIG. 9 is an exploded perspective view illustrating the build up structure of a multilayer filter array according to conventional techniques.

Moreover, it is a structure wherein the capacitors 41 through 48 corresponding to respective plurality of lines are formed by the insulator layers 2 through 17 and the conductive patterns 1A through 17A, which are respectively arranged upon the 17 layers of the insulator layers 1 through 17, whereby only a single conductive pattern, which configures a capacitor corresponding to a respective line, of these capacitors 41 through 48 corresponding to respective plurality of lines, is respectively arranged thereupon, and the arrangement and configuration of the conductive patterns forming the capacitors are made to differ from the conventional techniques illustrated in FIG. 9.

As a result, in this embodiment, not only are the coils 51 through 54 and capacitors 41 through 48 arranged on different insulator layers from each other, but is a structure wherein only a single conductive pattern, which configures a capacitor corresponding to a respective line, of these capacitors 41 through 48 corresponding to respective plurality of lines, is arranged upon each respective insulator layer 1 through 17. Thus, for example, by merely changing the width of the conductive patterns or the number of insulator layers, not only may the inductance of the coils 51 through 54 be adjusted, but the capacitance of the capacitors 41 through 48 may be independently and easily adjusted.

Furthermore, the conductive patterns 2A, 4A, 6A, 8A, 10A, 12A, 14A, 16A for signals and the conductive patterns 1A, 3A, 5A, 7A, 9A, 11A, 13A, 15A, 17A for ground exist as the conductive patterns forming the capacitors 41 through 48 of this embodiment. However, because only a single conductive pattern, which configures a capacitor corresponding to a respective line, of these capacitors 41 through 48 corresponding to respective plurality of lines, is arranged upon each respective insulator layer 1 through 17, the narrow portion 121, which existed on the conventional technique multilayer filter array, is gone in this embodiment. Thus, the inductance of the ground conductive patterns 1A, 3A, 5A, 7A, 9A, 11A, 13A, 15A, 17A forming the capacitors 41 through 48 becomes small in this embodiment.

Next, by describing the comparison of FIG. 6, which represents damping characteristic data of the multilayer filter array 80 according to this embodiment, and FIG. 12, which represents damping characteristic data of the conventional multilayer filter array, the above-mentioned contents will be described in detail.

Figure 6:
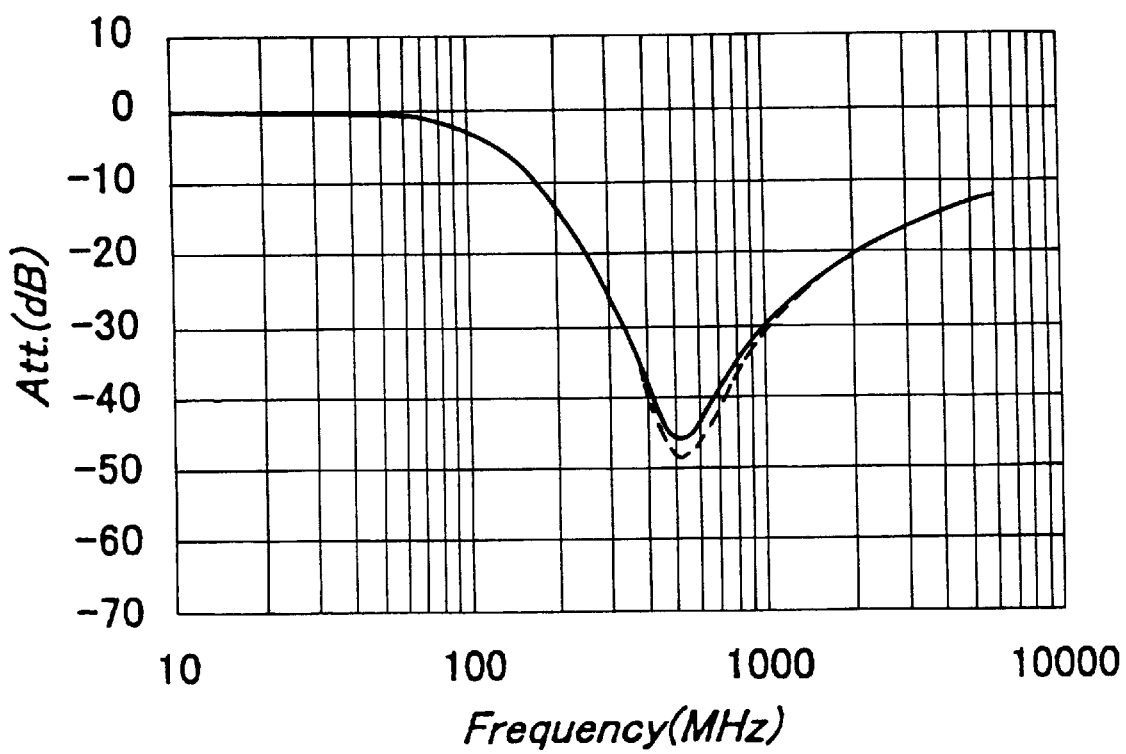
FIG. 6 is a diagram showing a graph, which illustrates damping characteristics of the first embodiment of the present invention.
Figure 12:
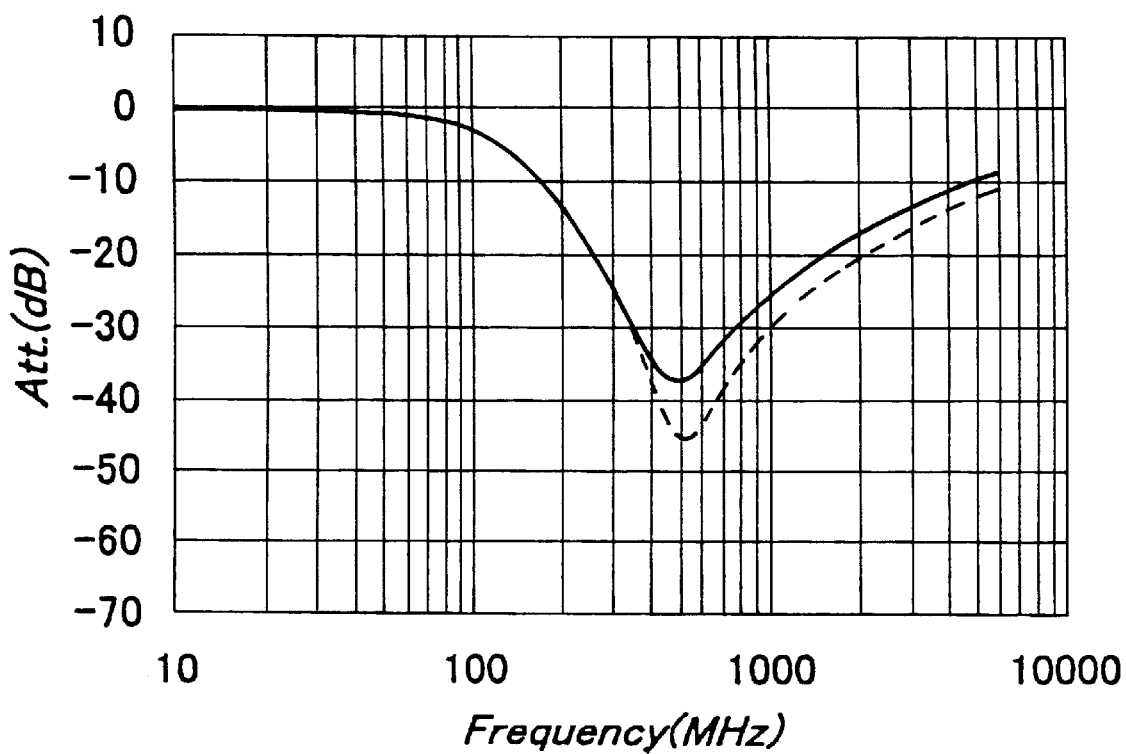
FIG. 12 is a diagram showing a graph, which illustrates damping characteristics of the multilayer filter array according to conventional techniques.

When compared to the data in FIG. 12, differences between the damping characteristics (indicated by the dotted line in FIG. 6) in the circuit that connects the external electrode 61 and external electrode 65, and the damping characteristics (indicated by the solid line in FIG. 6) in the circuit that connects the external electrode 62 and external electrode 66 in the data of this FIG. 6 decrease. In other words, effectiveness of the multilayer filter array 80 of this embodiment are verified with the graph of FIG. 6.

Thus, according to this embodiment, since the degradation of the damping characteristics is reduced, the originally designed strong damping characteristics are obtained; moreover since no difference of inductance between each signal line made from the respective ground conductive patterns occurs, difference in damping characteristics between each signal line may be reduced. Moreover, as in this embodiment, by making all the ground conductive patterns have a common form, the inductance of all the ground conductive patterns become equal, and the difference in damping characteristics between each signal line is further reduced.

On one hand, as the conductive patterns, which determine the capacity of the capacitors 41 through 48 corresponding to respective lines, are not adjacent to each other within the same layer, the capacitor capacity that existed between each line with the conventional techniques does not exist, and cross talk is reduced.

On the other hand, in this embodiment, the coils 51 through 54 and capacitors 41 through 48 are connected therebetween by the external electrodes 61 through 68, which are arranged on the outside of the main layered body part 80A of the multilayer filter array 80. Thus, effective utilization of the internal portions of the multilayer filter array 80 is possible, and in addition, usage of conductive material that passes through the via holes and the like of the insulator layers is reduced, allowing for low cost fabrication of the multilayer filter array 80.

Moreover, in this embodiment, since the relative dielectric constant of the insulator layers 19 through 23 upon which the coils 51 through 54 are arranged is set to no more than 15, the capacitance values between the coils 51 through 54 are made smaller, and inter-channel cross talk is reduced.

Then, in this embodiment, the relative dielectric constant of the insulator layers 1 through 17, which form the capacitors 41 through 48, is set between 20 and 200. This is because taking into account characteristic degradation due to the capacitance generated between the input/output terminals, it is preferable that the relative dielectric constant of the insulator layers 1 through 17, which form the capacitors 41 through 48, is set to no more than 200. Furthermore, from the aspect of ensuring the necessary minimum capacitance value for the capacitors 41 through 48, this is because it is preferable that the relative dielectric constant of the insulator layers 1 through 17, which form the capacitors 41 through 48, is set to at least 20.

Figure 7:
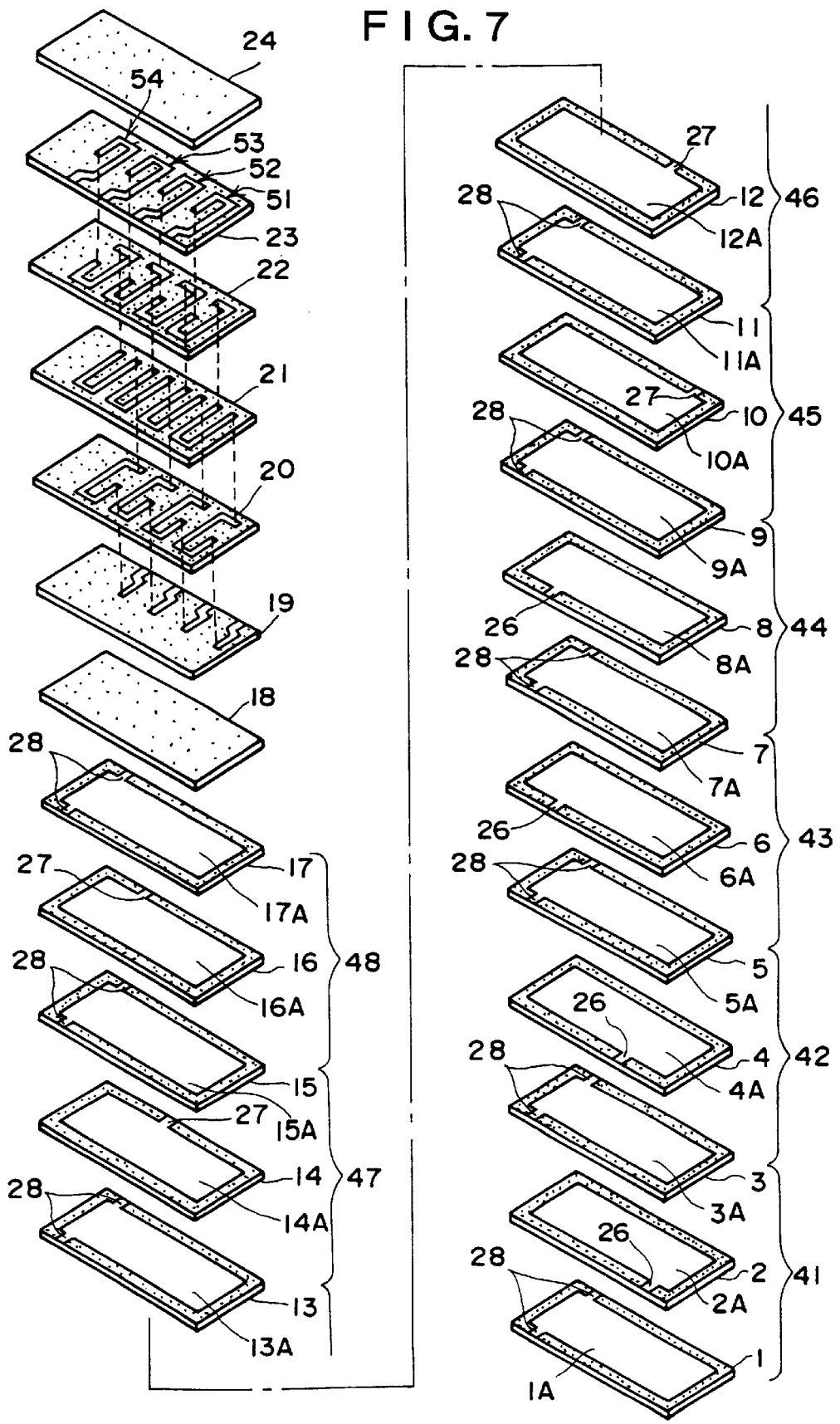
FIG. 7 is an exploded perspective view illustrating the build up structure of a multilayer filter array according to a second embodiment of the present invention.
Figure 8:
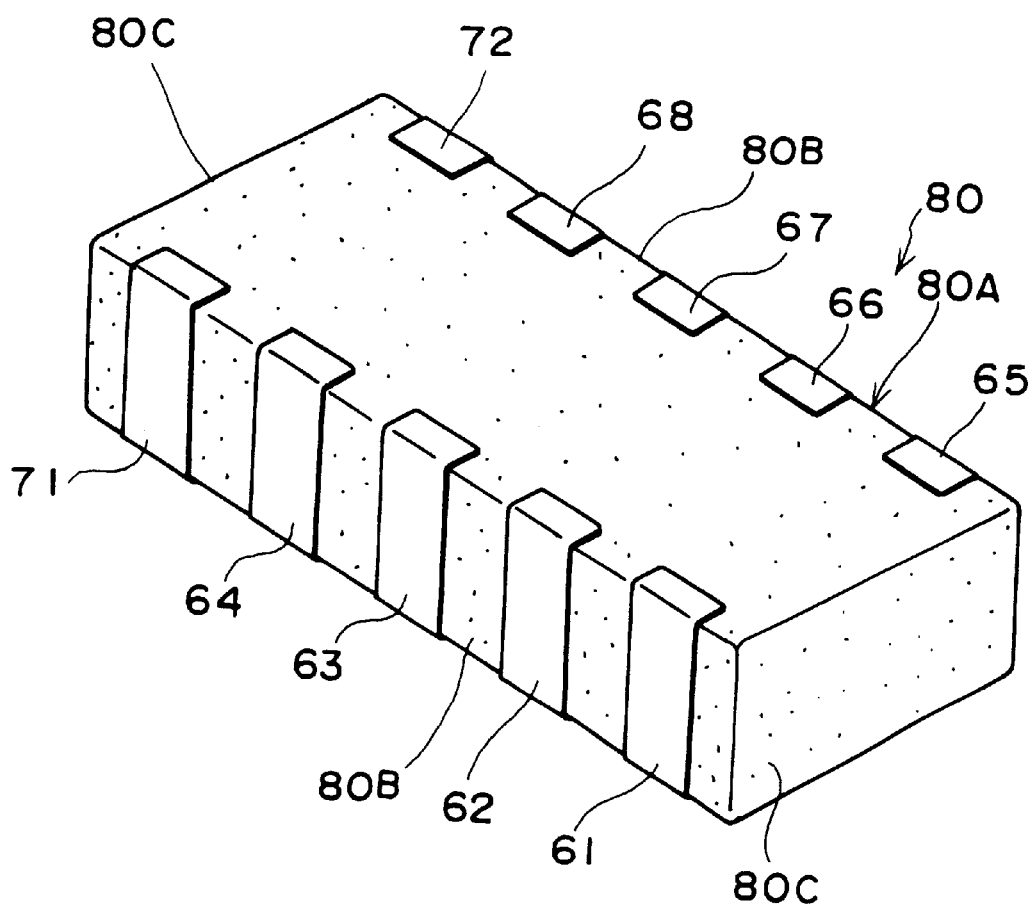
FIG. 8 is a perspective view illustrating the multilayer filter array according to the second embodiment of the present invention.

Next, a second embodiment according to the present invention is described based on FIG. 7 and FIG. 8. It should be noted that the same reference numerals are applied to the same parts as described in the first embodiment, and duplicate descriptions will be omitted.

A multilayer filter array 80 according to this embodiment illustrated in FIG. 7 and FIG. 8 has approximately the same configuration as in the first embodiment. However, in exchange for the lead-out portions 25, which are arranged upon the ground conductive patterns so as to protrude at both end surfaces 80C, in the first embodiment, lead-out portions 28 are arranged upon the ground conductive patterns of the multilayer filter array 80 according to this embodiment so as to protrude at both side surfaces 80B.

Accordingly, in this embodiment, it has a configuration wherein external electrodes 61 through 68, which are external signal electrodes connected to conductive patterns 2A, 4A, 6A, 8A, 10A, 12A, 14A, 16A for signaling, and external electrodes 71, 72, which are external ground electrodes connected to conductive patterns 1A, 3A, 5A, 7A, 9A, 11A, 13A, 15A, 17A for grounding, are configured side by side on the same side surface 80B of the main layered body part 80A, which is formed layering insulator layers 1 through 24.

In other words, since the external electrodes 61 through 68 and the external electrodes 71, 72 are arranged in a line on the same side surface 80B, external electrodes do not exist on both end surfaces 80C of the multilayer filter array 80, hence surfaces of the multilayer filter array 80 with no external electrodes increase. As a result, when other electronic devices are mounted next to either end surface 80C of this multilayer filter array 80 on a printed board upon which this type of multilayer filter array 80 is mounted, those other electronic devices can be deployed much closer, allowing higher density layout of electronic devices on printed boards.

It should be noted that in the above-mentioned embodiments, the present invention has been described with a multilayer filter array having a structure wherein four sets of noise filters are embedded; however, the present invention may employ a structure wherein the number of noise filters is not limited to four sets and may be less than three, or more noise filters may be embedded therein.

On the other hand, the multilayer filter array according to the second embodiment has a structure with a longer side surface than the one in the first embodiment; however, by narrowing the width and intervals of the conductive pattern lead-out portions, it is also possible to make it the same size as the one in the first embodiment.

According to the multilayer filter array of the present invention, beneficial results such as inductance and capacitance becoming independently adjustable, as well as disparity of damping characteristics between signal lines may be made smaller, may take effect.

What is claimed is:

1. A multilayer filter array, which is formed by layering a plurality of insulator layers in a state where a plurality of conductive patterns are internally arranged, comprising:
    coils corresponding to respective plurality of lines, which are formed by arranging the plurality of conductive patterns respectively to a single insulator layer; and
    capacitors corresponding to respective plurality of lines, which are formed by facing the conductive patterns to each other with insulator layers therebetween on insulator layers differing from the insulator layers the coils exist thereupon,
    wherein only a single conductive pattern, which configures a capacitor corresponding to a respective line, of the capacitors corresponding to respective plurality of lines, is deployed on each respective insulator layer forming each of the capacitors.

2. The multilayer filter array, according to claim 1, wherein
    the relative dielectric constant of the insulator layers forming the capacitors is set between 20 and 200, and the relative dielectric constant of the insulator layers the coils are arranged thereupon is set to no more than 15.

3. The multilayer filter array, according to claim 1, wherein
    the insulator layers are configured by material containing alumina and glass.

4. The multilayer filter array, according to claim 1, wherein
    the conductive patterns are formed by printing a conductive paste onto the insulator layers.

5. The multilayer filter array, according to claim 1, wherein
    the coils include a plurality of via holes, which respectively pass through the insulator layers, whereby the conductive patterns upon differing insulator layers are mutually connected thereto through these via holes.

6. The multilayer filter array, according to claim 1, wherein
    at least one insulator layer without a conductive pattern is arranged between the insulator layers forming the coils and the insulator layers forming the capacitors.

7. A multilayer filter array, which is formed by layering a plurality of insulator layers in a state where a plurality of conductive patterns are internally arranged, comprising:
    coils corresponding to respective plurality of lines, which are formed by arranging the plurality of conductive patterns respectively to a single insulator layer; and
    capacitors corresponding to respective plurality of lines, which are formed by facing the conductive patterns to each other with insulator layers therebetween on insulator layers differing from the insulator layers the coils exist thereupon,
    wherein only a single conductive pattern, which configures a capacitor corresponding to a respective line, of the capacitors corresponding to respective plurality of lines, is deployed on each respective insulator layer forming each of the capacitors, and
    external electrodes are arranged on the outside of a main layered body part, which is formed by layering the insulator layers, thereby the coils and the capacitors are connected by these external electrodes.

8. The multilayer filter array, according to claim 7, wherein
    the relative dielectric constant of the insulator layers forming the capacitors is set between 20 and 200, and the relative dielectric constant of the insulator layers the coils are arranged thereupon is set to no more than 15.

9. The multilayer filter array, according to claim 7, wherein
    the insulator layers are configured by material containing alumina and glass.

10. The multilayer filter array, according to claim 7, wherein
    the conductive patterns are formed by printing a conductive paste onto the insulator layers.

11. The multilayer filter array, according to claim 7, wherein
    the main layered body part is formed by layering as well as firing the insulator layers, and the external electrodes are deployed upon this main layered body part through plating.

12. The multilayer filter array, according to claim 7, wherein
    the external electrodes are made as external signal electrodes, which connect to the conductive patterns for signaling, and external ground electrodes, which connect to the conductive patterns for grounding, are arranged on surfaces of the main layered body part differing from the surfaces these external signal electrodes are arranged thereupon.

13. The multilayer filter array, according to claim 12, wherein
    the external signal electrodes exist only in numbers corresponding to the coil and capacitor line numbers.

14. A multilayer filter array, which is formed by layering a plurality of insulator layers in a state where a plurality of conductive patterns are internally arranged, comprising:

coils corresponding to respective plurality of lines, which are formed by arranging the plurality of conductive patterns respectively to a single insulator layer; and capacitors corresponding to respective plurality of lines, which are formed by facing the conductive patterns to each other with insulator layers therebetween on insulator layers differing from the insulator layers the coils exist thereupon, wherein only a single conductive pattern, which configures a capacitor corresponding to a respective line, of the capacitors corresponding to respective plurality of lines, is deployed on each respective insulator layer forming each of the capacitors, and external signal electrodes, which connect to the conductive patterns for signaling, and external ground electrodes, which connect to the conductive patterns for grounding, are arranged side by side on the same side surface of a main layered body part, which is formed by layering insulator layers.

15. The multilayer filter array, according to claim 14, wherein
the relative dielectric constant of the insulator layers forming the capacitors is set between 20 and 200, and the relative dielectric constant of the insulator layers the coils are arranged thereupon is set to no more than 15.

16. The multilayer filter array, according to claim 14, wherein
the insulator layers are configured by material containing alumina and glass.

17. The multilayer filter array, according to claim 14, wherein
the conductive patterns are formed by printing a conductive paste onto the insulator layers.

18. The multilayer filter array, according to claim 14, wherein
the main layered body part is formed by layering as well as firing the insulator layers, and the external signal electrodes and external ground electrodes are deployed upon this main layered body part through plating.

19. The multilayer filter array, according to claim 14, wherein
the external signal electrodes exist only in numbers corresponding to the coil and capacitor line numbers.

* * * * *